US008964932B2

(12) United States Patent
Wu et al.

(10) Patent No.: US 8,964,932 B2
(45) Date of Patent: Feb. 24, 2015

(54) SHIFT REGISTER, GATE DRIVING CIRCUIT AND DISPLAY (71) Applicant: BOE Technology Group Co., Ltd., Beijing (CN)

(72) Inventors: Zhongyuan Wu, Beijing (CN); Liye Duan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 13 days.

(21) Appl. No.: 13/995,498

(22) PCT Filed: Nov. 30, 2012

(86) PCT No.: PCT/CN2012/085682
§ 371 (c)(1),
(2) Date: Jun. 18, 2013

(87) PCT Pub. No.: WO2013/152595
PCT Pub. Date: Oct. 17, 2013

(65) Prior Publication Data
US 2014/0064438 A1 Mar. 6, 2014

(51) Int. Cl.
G11C 19/00 (2006.01)
G09G 3/36 (2006.01)
G09G 3/20 (2006.01)
G11C 19/28 (2006.01)
G09G 3/32 (2006.01)

(52) U.S. Cl.
CPC ............... *G09G 3/3648* (2013.01); *G09G 3/20* (2013.01); *G11C 19/28* (2013.01); *G09G 3/3225* (2013.01)
USPC .................................. 377/64; 377/78; 377/79

(58) Field of Classification Search
None
See application file for complete search history.

(56) References Cited

U.S. PATENT DOCUMENTS

| 7,778,379 | B2 * | 8/2010 | Liao et al. ........................ 377/64 |
| 7,817,770 | B2 * | 10/2010 | Chang et al. .................... 377/64 |
| 7,928,942 | B2 * | 4/2011 | Kuo et al. ........................ 345/87 |
| 8,633,888 | B2 * | 1/2014 | Kim et al. ...................... 345/100 |
| 8,731,136 | B2 * | 5/2014 | Shin et al. ....................... 377/64 |
| 2005/0156856 | A1 | 7/2005 | Jang et al. |
| 2007/0217563 | A1 * | 9/2007 | Chang et al. ..................... 377/64 |

(Continued)

FOREIGN PATENT DOCUMENTS

| CN | 1637549 A | 7/2005 |
| CN | 102024500 A | 4/2011 |
| CN | 102682689 A | 9/2012 |

OTHER PUBLICATIONS

English Abstract of CN102682689(A), listed above, 1 page.
English Abstract of CN102024500(A), listed above, 1 page.
English Abstract of CN1637549(A), listed above, 1 page.
International Search Report (Chinese language) issued by the International Searching Authority regarding PCT application No. PCT/CN2012/085682, Jul. 3, 2013, 13 pages.

(Continued)

*Primary Examiner* — Tuan T Lam (57) ABSTRACT

A shift register, comprising a plurality of shift register sub-units connected in cascade, each of the plurality of shift register sub-units comprising first to third TFTs, an eleventh TFT, a first capacitor and a first reset control module for controlling the second TFT to be turned on or off. Besides the shift register sub-unit at a first stage, for each of the shift register sub-units at other stages, the second TFT gate control terminal thereof is connected to the third TFT gate control terminal of the shift register sub-unit at a previous stage. Accordingly, a gate driving circuit comprising the shift register and a display comprising the gate driving circuit are provided. Compared with the prior art, reliability of the shift register is highly improved and area occupied by the shift register is smaller.

15 Claims, 4 Drawing Sheets

(56) References Cited

U.S. PATENT DOCUMENTS

| | | | | |
|---|---|---|---|---|
| 2008/0285705 | A1* | 11/2008 | Wei et al. | 377/78 |
| 2009/0058790 | A1* | 3/2009 | Chiang et al. | 345/100 |
| 2010/0150301 | A1* | 6/2010 | Chan et al. | 377/64 |
| 2011/0057926 | A1 | 3/2011 | Shang | |
| 2011/0122988 | A1 | 5/2011 | Miyayama et al. | |
| 2011/0286572 | A1* | 11/2011 | Shang et al. | 377/67 |
| 2012/0113088 | A1* | 5/2012 | Han et al. | 345/212 |
| 2014/0050294 | A1* | 2/2014 | Cao et al. | 377/54 |

OTHER PUBLICATIONS

First Office Action issued by the Chinese Patent Office for Chinese Patent Application No. 2012101096869, 5pgs.

English translation of First Office Action issued by the Chinese Patent Office for Chinese Patent Application No. 2012101096869, 5pgs.

PCT International Preliminary Report on Patentability issued Oct., 14, 2014 by the International Bureau of Wipo for international application No. PCT/CN2012/085682, 8 pp.

* cited by examiner

SHIFT REGISTER, GATE DRIVING CIRCUIT AND DISPLAY

CROSS REFERENCE TO RELATED APPLICATIONS

This application is based on International Application No. PCT/CN2012/085682 filed on Nov. 30, 2012, which claims priority to Chinese National Application No. 201210109686.9, filed on Apr. 13, 2012, the contents of which are incorporated herein by reference.

FIELD OF THE DISCLOSURE

The present disclosure relates to the technical field of display manufacture, and particularly to a shift register, a gate driving circuit comprising the shift register and a display comprising the gate driving circuit.

BACKGROUND

Figure 1:
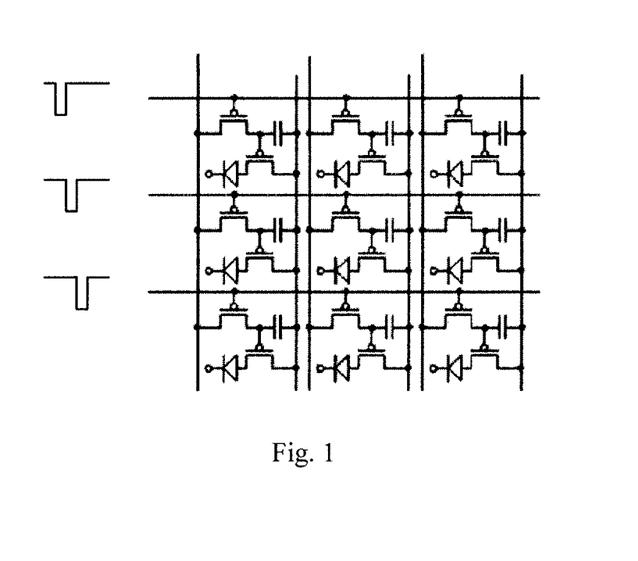
FIG. 1 is a schematic diagram showing operating principle of an AMOLED display.

In both of Liquid Crystal Displays (LCD) and Organic Light-Emitting Diode (OLED) displays, there is an active matrix formed by a plurality of scan lines and a plurality of data lines intersecting with each other. Taking an Active Matrix OLED (AMOLED) display as an example, there is an active matrix formed by respective scan lines and respective data lines intersecting with each other, as shown in FIG. 1, and the operating principle thereof is: turning on switching transistors on each of the respective scan lines in sequence by scanning the respective scan lines progressively, and then transmitting voltages on respective data lines to respective pixel driving transistors respectively to convert the voltages into currents for driving respective OLEDs.

A gate driving circuit (that is, a driving circuit for the scan line) is usually implemented by shift registers. Shift registers can be divided into dynamic shift registers and static shift registers. The dynamic shift register generally has a relative simple structure and contains a small amount of Thin Film Transistors (TFT), but has disadvantages of large power consumption and limited bandwidth of operation frequency. The static shift register contains a large amount of TFTs, but has advantages of low power consumption and large bandwidth of operation frequency.

As the size of a display panel increases, a gate driving circuit is often manufactured directly on the display panel, so as to reduce interconnections between the gate driving circuit and external driving circuits and thus reduce the size and cost of the display panel. A gate driving circuit designed on the basis of the display panel is generally implemented by the dynamic shift register which often adopts a dynamic circuit composed of N-type or P-type TFTs, since such designed gate driving circuit does not require a high speed but requires a compact structure and a small area.

Figure 2A:
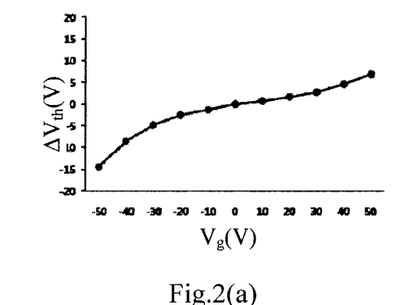
FIG. 2(a) is a schematic diagram showing relationship between threshold voltage $\Delta V_{th}$ and gate voltage $V_g$ of an Oxide TFT.
Figure 2B:
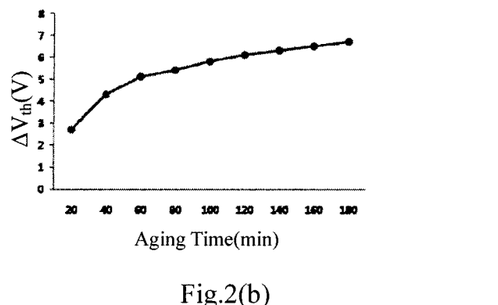
FIG. 2(b) is a schematic diagram showing relationship between the threshold voltage $\Delta V_{th}$ and aging time.

There are various kinds of processes for manufacturing a display plane at present, for example, amorphous silicon (a—Si) TFT, Low Temperature Polycrystal Silicon (LIPS) TFT, Oxide TFT, and so on. LIPS TFT has the advantages of rapid speed and great stability, but has the disadvantages of low uniformity and high cost, and thus is not suitable for the preparation of a large scale panel. The process of a—Si TFT is relatively mature and has low cost, but the a—si TFT has the disadvantages of low mobility and low stability. Oxide TFT has the advantages of high mobility, great uniformity and low cost, but has the disadvantage of low stability. As shown in FIG. 2(a) and FIG. 2(b), during an aging test for Oxide TFT, a threshold voltage $\Delta V_{th}$ increases gradually as an applied gate voltage $V_g$ and the aging time increase. With the increasing of the threshold voltage of TFT, turning-on current and speed of TFT decrease. If the threshold voltage finally increases to a voltage higher than a maximum voltage applied on a gate of TFT, the TFT can not be normally turned on, causing malfunction or failure of the gate driving circuit.

Figure 3A:
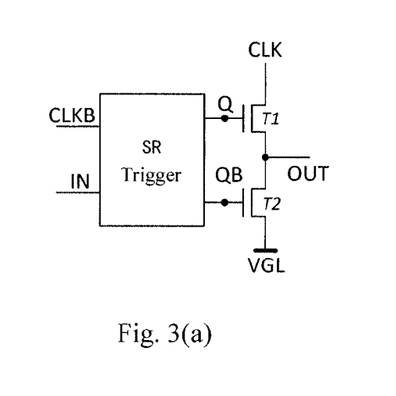
FIG. 3(a) is a schematic structural diagram of a conventional shift register sub-unit.
Figure 3B:
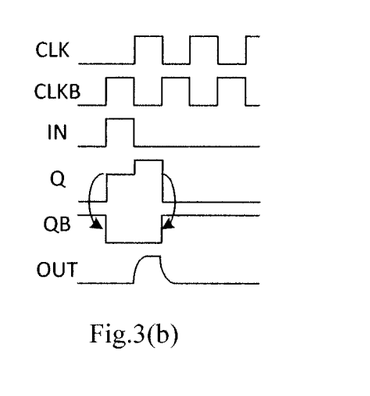
FIG. 3(b) is a timing control diagram for FIG. 3(a)

A conventional shift register usually comprises a plurality of shift register sub-units connected in cascade, and each of the plurality of shift register sub-units corresponds to a scan line. As shown in FIG. 3(a) and FIG. 3(b), a conventional shift register sub-unit comprises TFTs T1 and T2 (both being N-type TFTs), wherein TFT T1 is used for transmitting a high level from a clock signal CLK to an output terminal OUT, and TFT T2 is used for transmitting a low level from a low level signal VGL to the output terminal OUT. It can be seen that, when a progressive scan is adopted, during the scan time of a frame of image (for example, if a screen refresh frequency for the display panel is 60 Hz, the scan time for a frame of image is 17 ms), each shift register sub-unit corresponding to a scan line outputs the high level from the output terminal OUT only in the scan time for the scan line, that is, a point QB is at the high level to turn on the TFT T2 at most of the time. Therefore, gates of TFTs T2 in a whole shift register circuit are applied with the high level for a long time, and thus aging speeds thereof are faster and the threshold voltages thereof increase gradually. TFT T2 can not be normally turned on if the threshold voltage thereof finally increases to an extent that the high level at the point QB is not sufficient to turn on TFT T2, causing TFT T2 failing to transmit the low level form the low level signal VGL to the output terminal OUT. Meanwhile, the output terminal of TFT is floating when TFT can not be normally turned on. At this time, if the shift register suffers from interference of external signals, the respective shift register sub-units may output the high level by mistake, causing display malfunction and low reliability of the display panel.

SUMMARY

With respect to the above problems in the prior art, a technical problem to be solved by the present disclosure is to provide a shift register, a gate driving circuit comprising the shift register and a display comprising the gate driving circuit, capable of improving reliability while reducing occupied area.

According to an aspect, there is provided a shift register comprising a plurality of shift register sub-units connected in cascade, each of the plurality of shift register sub-units comprising:

a first Thin Film Transistor (TFT) having a gate connected to a first node, a source connected to a signal output terminal and a drain connected to a first clock signal input terminal;

a second TFT having a gate connected to a second TFT gate control terminal, a source connected to a level signal input terminal and a drain connected to the signal output terminal;

a third TFT having a gate connected to a third TFT gate control terminal, a source connected to the level signal input terminal and a drain connected to the signal output terminal;

an eleventh TFT having a gate connected to a second clock signal input terminal, a source connected to the first node and a drain connected to a signal input terminal;

a first capacitor connected between the first node and the signal output terminal;

a first reset control module connected to the source of the eleventh TFT, the level signal input terminal, the signal input terminal, the first clock signal input terminal, the second clock signal input terminal and the second TFT gate control terminal, respectively, and for controlling the second TFT to be turned on or off, wherein, besides the shift register sub-unit at a first stage, for each of the shift register sub-units at other stages, the second TFT gate control terminal thereof is connected to the third TFT gate control terminal of the shift register sub-unit at a previous stage, that is, the first reset control module thereof is further used for controlling the third TFT in the shift register sub-unit at the previous stage to be turned on or off.

Preferably, the first reset control module comprises:

a sixth TFT having a gate connected to the signal input terminal, a source connected to the level signal input terminal and a drain connected to the second TFT gate control terminal;

a seventh TFT having a gate connected to the first clock signal input terminal, a source connected to the level signal input terminal and a drain connected to the second TFT gate control terminal;

a eighth TFT having a gate connected to a second node, a source connected to the second TFT gate control terminal and a drain connected to the second clock signal input terminal;

a ninth TFT having a gate connected to the second clock signal input terminal, a source connected to the second node and a drain connected to the second clock signal input terminal;

a tenth TFT having a gate connected to the source of the eleventh TFT, a source connected to the level signal input terminal and a drain connected to the second node.

Alternatively, the first reset control module comprises:

a sixth TFT having a gate connected to the signal input terminal, a source connected to the level signal input terminal and a drain connected to the second TFT gate control terminal;

a seventh TFT having a gate connected to the first clock signal input terminal, a source connected to the level signal input terminal and a drain connected to the second TFT gate control terminal;

a ninth TFT having a gate connected to the second clock signal input terminal, a source connected to the second TFT gate control terminal and a drain connected to the second clock signal input terminal;

a tenth TFT having a gate connected to the source of the eleventh TFT, a source connected to the level signal input terminal and a drain connected to the second TFT gate control terminal.

Preferably, a width-length ratio of the tenth TFT is 5~10 times of a width-length ratio of the ninth TFT.

Preferably, the shift register sub-unit further comprises a second reset control module connected to the first node, the second TFT gate control terminal, the third TFT gate control terminal and the level signal input terminal, respectively, and for controlling the first node to be reset.

Further preferably, the second reset control module comprises:

a fourth TFT having a gate connected to the third TFT gate control terminal, a source connected to the level signal input terminal and a drain connected to the first node;

a fifth TFT having a gate connected to the second TFT gate control terminal, a source connected to the level signal input terminal and a drain connected to the first node.

Preferably, an initial pulse signal is inputted to the signal input terminal of the shift register sub-unit at the first stage; and besides the shift register sub-unit at a last stage, for each of the shift register sub-units at other stages, the signal output terminal thereof is connected to the signal input terminal of the shift register sub-unit at a next stage;

in each of the shift register sub-units, a clock signal inputted from the second clock signal input terminal is inverse to a clock signal inputted from the first clock signal input terminal;

clock signals inputted from the first clock signal input terminals of the shift register sub-units at two adjacent stages are inverse to each other, and clock signals inputted from the second clock signal input terminals of the shift register sub-units at two adjacent stages are inverse to each other.

Preferably, respective TFTs included in each of the shift register sub-units are all N-type TFTs or P-type TFTs.

According to another aspect of the present disclosure, a gate driving circuit comprising the above described shift register is provided.

According to another aspect of the present disclosure, a display comprising the above described gate driving circuit is provided.

Advantageous Effects

1) The shift register according to embodiments of the present disclosure comprises a plurality of shift register sub-units connected in cascade, the second TFT and the third TFT in the shift register sub-unit are turned on alternately to transmit the level signal of the level signal input terminal to the signal output terminal alternately (for N-type TFT, the level signal input terminal is a low level signal input terminal; and for P-type TFT, the level signal input terminal is a high level signal input terminal). Compared with transmitting the level signal of the level signal input terminal to the signal output terminal by only one TFT in the prior art, the reliability of the shift register is highly improved;

The first reset control module in the shift register sub-unit is not only used for controlling the second TFT in the shift register sub-unit at the current stage to be turned on or off, but also reused for controlling the third TFT in the shift register sub-unit at a previous stage to be turned on or off. That is, for each of the shift register sub-units, only one first reset control module is needed to control the second TFT to be turned on or off, and the third TFT is controlled to be turned on or off by the first reset control module in the shift register sub-unit at the next stage. Therefore, the shift register according to the embodiments of the present disclosure occupies a small area.

2) The shift register according to the embodiments of the present disclosure has a simple structure and a low cost.

DETAILED DESCRIPTION

In order to make the technical solutions of embodiments of the present disclosure to be understood by those skilled in the art thoroughly, further descriptions will be made in detail for a shift register, a gate driving circuit comprising the shift register and a display comprising the gate driving circuit according to embodiments of the present disclosure, taken in conjunction with the accompanying drawings and particular implementations.

The shift register comprises a plurality of shift register sub-units connected in cascade, each of the plurality of shift register sub-units comprises:

a first Thin Film Transistor (TFT) having a gate connected to a first node, a source connected to a signal output terminal and a drain connected to a first clock signal input terminal;

a second TFT having a gate connected to a second TFT gate control terminal, a source connected to a level signal input terminal and a drain connected to the signal output terminal;

a third TFT having a gate connected to a third TFT gate control terminal, a source connected to the level signal input terminal and a drain connected to the signal output terminal;

an eleventh TFT having a gate connected to a second clock signal input terminal, a source connected to the first node and a drain connected to a signal input terminal;

a first capacitor connected between the first node and the signal output terminal;

a first reset control module connected to the source of the eleventh TFT, the level signal input terminal, the signal input terminal, the first clock signal input terminal, the second clock signal input terminal and the second TFT gate control terminal, respectively, for controlling the second TFT to be turned on or off, wherein, besides the shift register sub-unit at a first stage, for each of the shift register sub-units at other stages, the second TFT gate control terminal thereof is connected to the third TFT gate control terminal of the shift register sub-unit at a previous stage, that is, the first reset control module thereof is further used for controlling the third TFT in the shift register sub-unit at the previous stage to be turned on or off.

The gate driving circuit comprises the above described shift register.

The display comprises the above described gate driving circuit.

Embodiment 1

Figure 4:
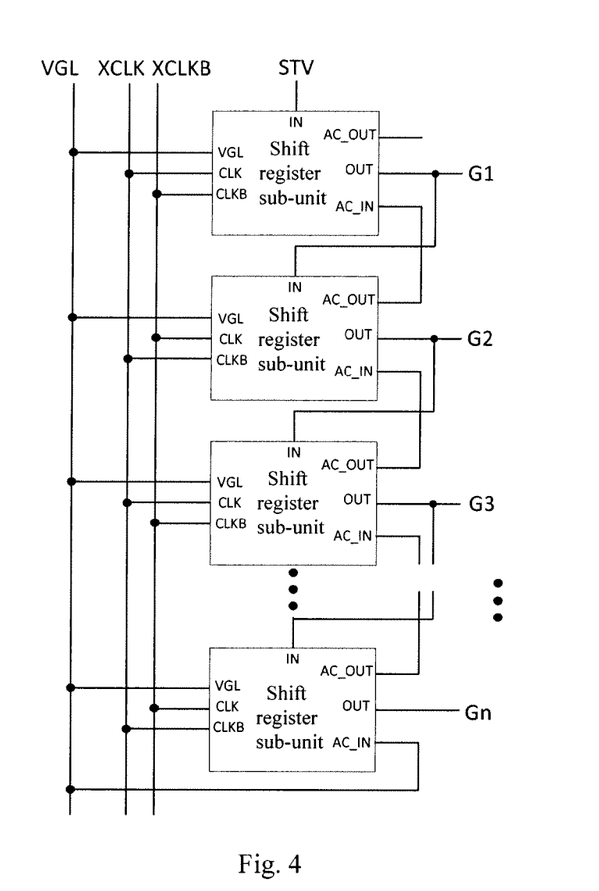
FIG. 4 is a schematic structural diagram of a shift register constituted by n shift register sub-units connected in cascade according to embodiment 1 of the present disclosure, wherein n is an integer.

As shown in FIG. 4, in the present embodiment, the shift register comprises n shift register sub-units connected in cascade, wherein n is an integer.

An initial pulse signal STV is inputted to the signal input terminal IN of the shift register sub-unit at the first stage. Besides the shift register sub-unit at a last stage, for each of the shift register sub-units at other stages, the signal output terminal OUT thereof is connected to the signal input terminal IN of the shift register sub-unit at a next stage. In each of the shift register sub-units, a clock signal inputted from the second clock signal input terminal CLKB is a signal inverse to a clock signal inputted from the first clock signal input terminal CLK, and both have a duty ratio of 50%.

Clock signals inputted from the first clock signal input terminals CLK of the shift register sub-units at two adjacent stages are inverse to each other, and clock signals inputted from the second clock signal input terminals CLKB of the shift register sub-units at two adjacent stages are inverse to each other. For example, with respect to the shift register sub-unit at the first stage, a first external clock signal XCLK is inputted to the first clock signal input terminal CLK, and a second external clock signal XCLKB is inputted to the second clock signal input terminal CLKB; with respect to the shift register sub-unit at a second stage, the second external clock signal XCLKB is inputted to the first clock signal input terminal CLK, and the first external clock signal XCLK is inputted to the second clock signal input terminal CLKB. The first external clock signal XCLK and the second external clock signal XCLKB are inverse to each other, and both have a duty ratio of 50%.

Figure 5:
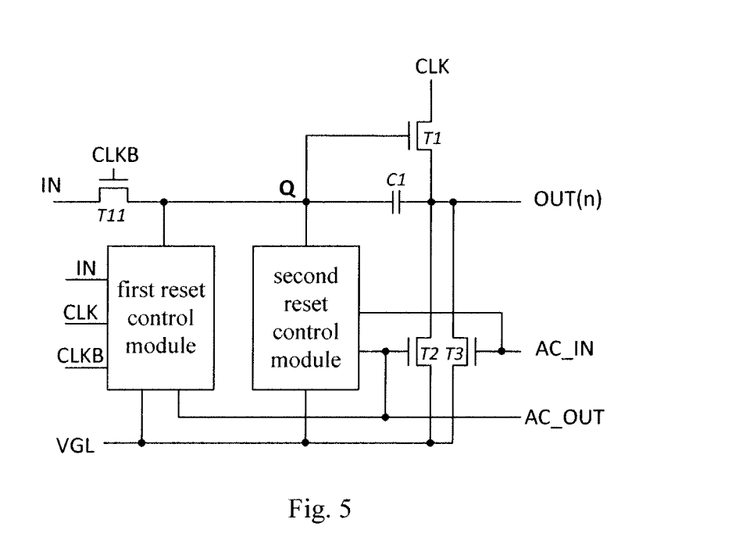
FIG. 5 is a schematic structural diagram of the shift register sub-unit according to embodiment 1 of the present disclosure.

As shown in FIG. 5, the shift register sub-unit comprises a first TFT T1, a second TFT T2, a third TFT T3, an eleventh TFT T11, a first capacitor, a first reset control module and a second reset control module.

In the present embodiment, respective TFTs included in the shift register are all N-type TFTs. Since the N-type TFT is turned on when a gate thereof is applied a high level signal and turned off when the gate is applied a low level signal, a level signal input terminal is implemented by a low level signal input terminal VGL in the present embodiment.

The first TFT T1 has a gate connected to a first node Q, a source connected to a signal output terminal OUT(n) and a drain connected to a first clock signal input terminal CLK. The first TFT T1 is used for transmitting a signal from the first clock signal input terminal CLK to the signal output terminal OUT(n), wherein n is an integer.

The second TFT T2 has a gate connected to a second TFT gate control terminal AC_OUT, a source connected to a low level signal input terminal VGL and a drain connected to the signal output terminal OUT(n). The second TFT T2 is used for transmitting a low level signal from the low level signal input terminal VGL to the signal output terminal OUT(n).

The third TFT T3 has a gate connected to a third TFT gate control terminal AC_IN, a source connected to the low level signal input terminal VGL and a drain connected to the signal output terminal OUT(n). The third TFT T3 is used for transmitting the low level signal from the low level signal input terminal VGL to the signal output terminal OUT(n).

The eleventh TFT T11 has a gate connected to a second clock signal input terminal CLKB, a source connected to the first node Q and a drain connected to a signal input terminal IN.

The first capacitor C1 is connected between the first node Q and the signal output terminal OUT(n).

The first reset control module is connected to the source of the eleventh TFT T11, the low level signal input terminal VGL, the signal input terminal IN, the first clock signal input terminal CLK, the second clock signal input terminal CLKB and the second TFT gate control terminal AC_OUT, respectively, and for controlling the second TFT T2 to be turned on or off.

Figure 6:
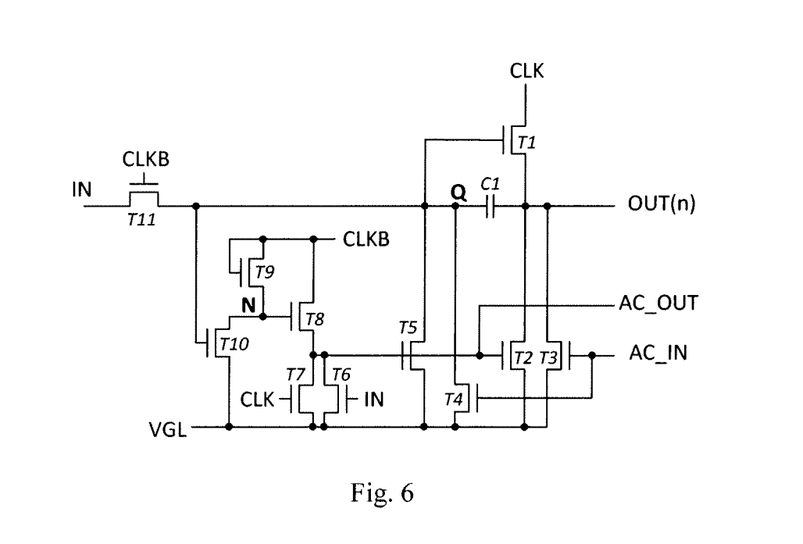
FIG. 6 is a schematic diagram showing a particular circuit of FIG. 5.

As shown in FIG. 6, in the present embodiment, the first reset control module comprises:

a sixth TFT T6 having a gate connected to the signal input terminal IN, a source connected to the low level signal input terminal VGL and a drain connected to the second TFT gate control terminal AC_OUT;

a seventh TFT T7 having a gate connected to the first clock signal input terminal CLK, a source connected to the low level signal input terminal VGL and a drain connected to the second TFT gate control terminal AC_OUT;

a eighth TFT T8 having a gate connected to a second node N, a source connected to the second TFT gate control terminal AC_OUT and a drain connected to the second clock signal input terminal CLKB;

a ninth TFT T9 having a gate connected to the second clock signal input terminal CLKB, a source connected to the second node N and a drain connected to the second clock signal input terminal CLKB;

a tenth TFT T10 having a gate connected to the source of the eleventh TFT T11 (that is, to the first node Q), a source connected to the low level signal input terminal VGL and a drain connected to the second node N.

By setting a proportion between a width-length ratio of the tenth TFT T10 and a width-length ratio of the ninth TFT T9, the source of the ninth TFT T9 (i.e., the drain of the T10) can be at the low level when high level signals are inputted from the second clock signal input terminal CLKB and the signal input terminal IN (at this time, the tenth TFT T10 and the ninth TFT T9 are turned on). Alternatively, the width-length ratio of the tenth TFT T10 is much more larger than the width-length ratio of the ninth TFT T9, and a resistance of the ninth TFT T9 is much more larger than a resistance of the tenth TFT T10. Therefore, when high level signals are inputted from the second clock signal input terminal CLKB and the signal input terminal IN, the source of the ninth TFT T9 (i.e., the drain of the T10) is at the low level due to a voltage division caused by the resistance of the ninth TFT T9 and the resistance of the tenth TFT T10. It is preferable that the width-length ratio of the tenth TFT T10 is 5~10 times of the width-length ratio of the ninth TFT T9.

In the shift register according to the present embodiment of the present disclosure, besides the shift register sub-unit at a first stage, for each of the shift register sub-units at other stages, the second TFT gate control terminal AC_OUT thereof is connected to the third TFT gate control terminal AC_IN of the shift register sub-unit at a previous stage, that is, the first reset control module thereof is further used for controlling the third TFT T3 in the shift register sub-unit at the previous stage to be turned on or off, and the third TFT gate control terminal AC_IN of the shift register sub-unit at a last stage is connected to the low level signal input terminal VGL (that is, AC_IN is set at the low level and does not operate).

Figure 7:
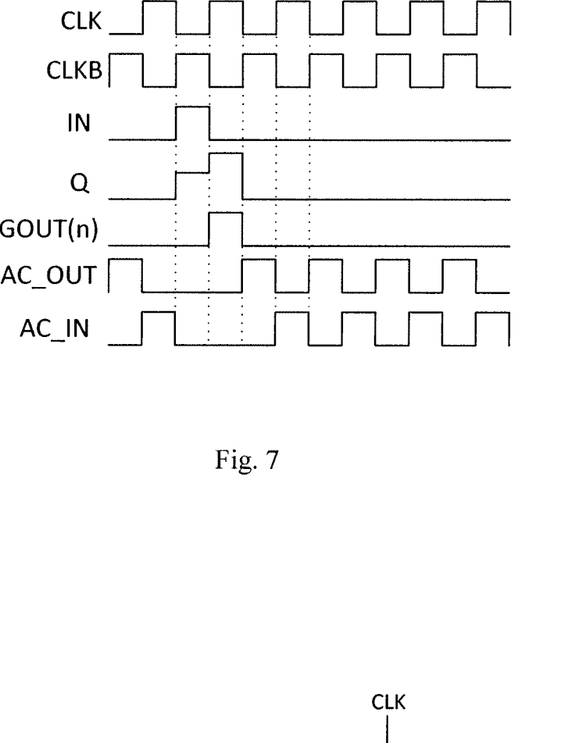
FIG. 7 is a timing control diagram for the shift register sub-unit according to embodiment 1 of the present disclosure.

Through the above described settings, in the shift register sub-units at two adjacent stages, compared with the signal outputted from the second TFT gate control terminal AC_OUT of the shift register sub-unit at the former stage, the signal outputted from the second TFT gate control terminal AC_OUT of the shift register sub-unit at the latter stage right shifts (that is, along the direction the pulse signal proceeds) a pulse width (please refer to FIG. 7). The second TFT gate control terminal AC_OUT of the shift register sub-unit at the latter stage is connected to the third TFT gate control terminal AC_IN of the shift register sub-unit at the former stage, that is, in each of the shift register sub-units, the signal inputted from the third TFT gate control terminal AC_IN right shifts a pulse width compared with the signal outputted from the second TFT gate control terminal AC_OUT. As for each shift register sub-unit, after the switching transistor for driving the corresponding scan line is turned on, that is, after the signal output terminal of the shift register sub-unit outputs a high level signal, the second TFT gate control terminal AC_OUT of the shift register sub-unit outputs a clock signal with a duty ratio of 50%. Therefore, the signal inputted from the third TFT gate control terminal AC_IN and the signal outputted from the second TFT gate control terminal AC_OUT are inverse to each other, and both have a duty ratio of 50%.

The second TFT gate control terminal AC_OUT is connected to the gate of the second TFT T2 and the third TFT gate control terminal AC_IN is connected to the gate of the third TFT T3, and through such a setting, the signal outputted from the second TFT gate control terminal AC_OUT and the signal inputted from the third TFT gate control terminal AC_IN are inverse to each other after the signal output terminal outputs a high level signal. As a result, the second TFT T2 and the third TFT T3 are alternately turned on (the clock signal outputted from the second TFT gate control terminal AC_OUT and the clock signal inputted from the third TFT gate control terminal AC_IN are used for controlling the second TFT T2 and the third TFT T3 to be turned on or off, respectively, that is, a double clock reset).

In the shift register having such a structure, the second TFT T2 and the third TFT T3 are turned on alternately to output the low level signal to the signal output terminal alternately, avoiding the defects of failing to turn on a TFT and thus having floating output due to the rapid aging speed and continuous increasing of the threshold voltage caused by transmitting the low level signal to the signal output terminal through only one said TFT in the prior art, reducing threshold drifts of the second TFT T2 and the third TFT T3, and improving the stability and lifespan of the shift register.

Meanwhile, for each of the shift register sub-units, the first reset control module therein is not only used for controlling the second TFT T2 in the shift register sub-unit at the current stage to be turned on so as to make the shift register sub-unit at the current stage output a low level signal, but also reused for controlling the third TFT T3 in the shift register sub-unit at a previous stage to be turned on so as to make the shift register sub-unit at the previous stage output a low level signal. Therefore, it is not necessary to design two control circuits for controlling the second TFT T2 and the third TFT T3 of the shift register sub-unit at the current stage to be turned on or off, respectively, only one reset control module is required for controlling the second TFT T2 of the shift register sub-unit at the current stage to be turned on or off, and the third TFT T3 of the shift register sub-unit at the current stage is controlled to be turned on or off by the first reset control module of the shift register sub-unit at a next stage (that is, the clock signal outputted from the second TFT gate control terminal AC_OUT of the shift register sub-unit at the next stage is reused). In such an arrangement, area occupied by circuit of the shift register is reduced, resources are reused effectively, and thus cost of the shift register is reduced.

The second reset control module is connected to the first node Q, the second TFT gate control terminal AC_OUT, the third TFT gate control terminal AC_IN and the low level signal input terminal VGL, respectively, and for controlling the first node Q to be reset.

As shown in FIG. 6, in the present embodiment, the second reset control module comprises:

a fourth TFT T4 having a gate connected to the third TFT gate control terminal AC_IN, a source connected to the low level signal input terminal VGL and a drain connected to the first node Q;

a fifth TFT T5 having a gate connected to the second TFT gate control terminal AC_OUT, a source connected to the low level signal input terminal VGL and a drain connected to the first node Q.

Herein, the reason why two TFTs are used to reset the first node Q is the same as that why the second TFT T2 and the third TFT T3 alternately transmit the low level signal from the low level signal terminal VGL, that is, avoiding the defects of failing to turn on a TFT and thus having floating output due to the rapid aging speed and continuous increasing of the threshold voltage caused by transmitting the low level signal to the first node Q through only one said TFT in the prior art.

Of course, the circuit structure of the second reset control module is not limited to the above described circuit structure and can further adopt other circuit structures capable of achieving the same function. For example, the second reset control module may only comprises one TFT having a gate connected to the second TFT gate control terminal AC_OUT and the third TFT gate control terminal AC_IN simultaneously; or the second reset control module may comprises a TFT in parallel to the fourth TFT T4 and/or a TFT in parallel to the fifth TFT T5, in addition to the fourth TFT T4 and the fifth TFT T5, and thus the TFT in parallel to the fourth TFT T4 and/or the TFT in parallel to the fifth TFT T5 can be used as backup TFTs to control the first node Q to be reset when the fourth TFT T4 and/or the fifth TFT T5 fail to be turned on.

It should be noted that, for a TFT, there is no distinct difference between a drain and a source, and thus the source of the TFT mentioned in the present disclosure may be the drain of the TFT, and the drain of the TFT may the source of the TFT.

As shown in FIG. 7, operating principles of the shift register sub-unit according to the present embodiment of the present disclosure are as follows:

A part of timing diagram shown in FIG. 7 is selected and divided into four periods consisting of a first period to a fourth period represented by I, II, III and IV in FIG. 7.

Hereinafter, for the sake of simplicity of the description, the TFT is represented only by a letter "T" and a corresponding number, for example, the first TFT is represented by T1; meanwhile, the first node is directly represented by point Q, the second node is directly represented by N, the first capacitor is directly represented by C1, the first clock signal input terminal is directly represented by CLK, the second clock signal input terminal is directly represented by CLKB, the low level signal input terminal is directly represented by VGL, the signal input terminal is directly represented by IN, the signal output terminal is directly represented by OUT(n), the third TFT gate control terminal is directly represented by AC_IN, and the second TFT gate control terminal is directly represented by AC_OUT.

1) A First Period (A Pre-Charging Period):

CLK inputs a low level signal, CLKB inputs a high level signal and IN inputs a high level signal, T11 is turned on and point Q is charged to a high level, such that T10 is turned on. Meanwhile, T9 is turned on by the high level signal inputted from CLKB, point N can be controlled at a low level to turn off T8 through setting a proportion between the width-length ratio of T10 and the width-length ratio of T9. It is preferable that, the width-length ratio of T10 is 5~10 times of the width-length ratio of T9 to make sure that the resistance of T9 is much more larger than the resistance of T10, and thus point N is set at a low level via a voltage division caused by the resistances of T9 and T10, and T8 is turned off. T7 is turned off by the low level signal inputted from CLK, T6 is turned on by the high level signal inputted from IN, and thus AC_OUT outputs the low level signal, which makes T2 and T5 being turned off. Since AC_OUT outputs the low level signal during a previous period (that is, the time period of a previous pulse width), AC_IN also inputs the low level signal at this period, so that T3 and T4 are turned off. Point Q is at the high level, and thus T1 is turned on. At this time, T1 is used for transmitting the low level signal from CLK to OUT(n), that is, OUT(n) outputs the low level signal.

2) A Second Period (An Evaluating Period)

CLK inputs a high level signal, CLKB inputs a low level signal and IN inputs a low level signal, T11 is turned off Point Q floats, the voltage at the point Q increases continuously due to the voltage difference stored across two ends of C1 during the previous period (that is, the pre-charging period), and thus T10 is turned on by the higher level at the point Q. Meanwhile, T9 is turned off by the low level signal inputted from CLKB, and the point N keeps the low level of the previous period (that is, the pre-charging period), such that T8 is turned of T7 is turned on by the high level signal inputted from CLK, T6 is turned off by the low level signal inputted from IN, such that AC_OUT outputs the low level signal, which makes T2 and T5 being turned off. Since AC_OUT outputs the low level signal during a previous period (that is, the pre-charging period), AC_IN also inputs the low level signal at this period, so that T3 and T4 are turned off. Compared with the previous stage, the voltage at the point Q increases continuously at this stage, and thus T1 is fully turned on. At this time, T1 is used for transmitting, to OUT(n), the high level signal from CLK without a threshold loss, that is, OUT(n) outputs the high level signal.

3) A Third Period (A Reset Period 1)

CLK inputs a low level signal, CLKB inputs a high level signal and IN inputs a low level signal, T11 is turned on and point Q is pulled down to a low level by the low level signal inputted from IN, such that T10 is turned off. Meanwhile, T9 is turned on by the high level signal inputted from CLKB and point N is pulled up, and the point N is further pulled up to a high level because of bootstrapping effect of the gate-source capacitance of T8, so that T8 is fully turned on and AC_OUT outputs the high level signal, which makes T2 and T5 being turned on. The voltage at point Q is further pulled down by the low level signal from VGL when T5 is turned on. Since AC_OUT outputs the low level signal during a previous period (that is, the evaluating period), AC_IN also inputs the low level signal at this period, so that T3 and T4 are turned off. T7 is turned off by the low level signal inputted from CLK, and T6 is turned off by the low level signal inputted from IN. T1 is turned on since the point Q is at the low level. At this time, T2 is used for transmitting the low level signal from VGL to OUT(n), that is, OUT(n) outputs the low level signal.

4) A Fourth Period (A Reset Period 2)

CLK inputs a high level signal, CLKB inputs a low level signal and IN inputs a low level signal, T11 is turned off. Since point Q is still at a low level, T10 is turned off. Meanwhile, T9 is turned off by the low level signal inputted from CLKB, and T6 is turned off by the low level signal inputted from IN. The point N keeps the high level signal of a previous period (that is, the reset period 1), so that T8 is turned on. T7 is turned on by the high level signal inputted from CLK, such that AC_OUT outputs the low level signal, which makes T2 and T5 being turned off. Since AC_OUT outputs the high level signal during a previous period (that is, the reset period 1), AC_IN also inputs the high level signal at this period, so that T3 and T4 are turned on. The point Q is further pulled down by the low level signal from VGL when T4 is turned on, so that the point Q can keep the low level without suffering from interference of other signals and thus T1 is turned off. At this time, T3 is used for transmitting the low level signal from VGL to OUT(n), that is, OUT(n) still outputs the low level signal.

In the first period to the fourth period, the signal input terminal IN inputs a high level signal during the first period, the signal output terminal OUT(n) outputs the high level signal during the second period, and thus one shift is achieved and the first period and the second period can be regarded as operating periods of the shift register sub-unit; In the third and fourth periods, the signal input terminal IN and the signal output terminal OUT(n) output a low level signal, and thus the third and fourth periods are low level maintaining periods of the signal output terminal of the shift register sub-unit.

FIG. 7 only shows a part of a timing control diagram of the shift register sub-unit. Every time the display displays a frame of image, a shift register sub-unit for controlling a certain line of pixels would output a high level signal. Particularly, all of the signal input terminal IN, the first clock signal input terminal CLK, the second clock signal input terminal CLKB, the first node Q, the signal output terminal OUT(n), the second TFT gate control terminal AC_OUT and the third TFT gate control terminal AC_IN will repeat the input timing sequences of the first and second periods; and then all of the signal input terminal IN, the first clock signal input terminal CLK, the second clock signal input terminal CLKB, the first node Q, the signal output terminal OUT(n), the second TFT gate control terminal AC_OUT and the third TFT gate control terminal AC_IN will repeat the input timing sequences of the third and fourth periods; the third and fourth periods will be repeated till the signal input terminal IN inputs the high level signal again, and under such a circumstance, the first and second periods will be repeated, and so on.

The number of the shift register sub-units in the shift register according to the embodiment of the present disclosure is larger than the number of scan lines in the display comprising the shift register. If the number of the scan lines is n−1, the number of the shift register sub-units is at least n, wherein n is a positive integer, it is because the second TFT gate control terminal AC_OUT of the shift register sub-unit at a $n^{th}$ stage has to provide a input signal to the third TFT gate control terminal AC_IN of the shift register sub-unit at a $(n-1)^{th}$ stage.

In the present embodiment, there is further provided a gate driving circuit comprising a shift register implemented by the above described shift register.

In the present embodiment, there is further provided a display comprising a matrix formed by a plurality of scan lines and a plurality of data lines intersecting with each other, wherein a gate driving circuit for driving the plurality of scan lines is implemented by the above described gate driving circuit.

It is preferable that the display comprises Liquid Crystal Display (LCD) or Organic Light-Emitting Diode (OLED).

Embodiment 2

Difference between the present embodiment and the embodiment 1 lies in that, in the present embodiment, the shift register sub-unit does not comprise the second reset control module. During the third period, the first node Q is pulled down by the low level signal inputted from the signal input terminal IN. During the fourth period, the first node Q floats and thus maintains the low level of the previous period (the third period).

Other arrangements and the functions thereof in the present embodiment are the same as those in the embodiment 1, and details omitted.

Embodiment 3

Difference between the present embodiment and the embodiment 1 lies in that, in the present embodiment, all of the plurality of TFTs included in the shift register are P-type TFTs. The P-type TFT is turned on when a gate thereof is applied with a low level signal and turned off when the gate is applied with a high level signal. The structure of the shift register adopting P-type TFTs is the same as that of the shift register adopting N-type TFTs, except that the low level signal input terminal VGL in the shift register adopting N-type TFTs is replaced with a high level signal input terminal VGH. Moreover, signals (CLK, CLKB, IN, Q, OUT(n), AC_OUT and AC_IN) in the timing control diagrams of the shift register sub-unit adopting P-type TFTs are inverse to the signals in the timing control diagrams (in FIG. 7) of the shift register sub-unit adopting N-type TFTs.

Other arrangements and the functions thereof in the present embodiment are the same as those in the embodiment 1, and details omitted.

Embodiment 4

Difference between the present embodiment and the embodiment 1 lies in that, the first reset control module in the present embodiment has a structure different from that of the first reset control module in the embodiment 1, but has the same function as that of the first reset control module in the embodiment 1.

Figure 8:
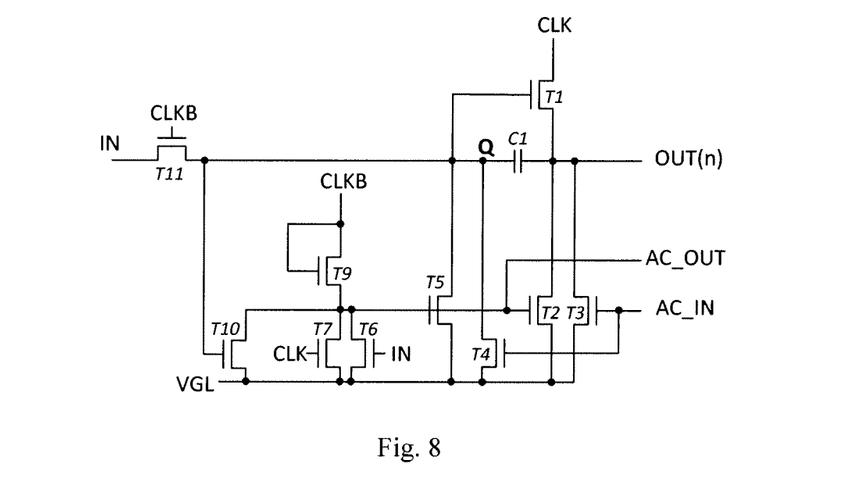
FIG. 8 is a schematic structural diagram of a shift register sub-unit according to embodiment 4 of the present disclosure.

As shown in FIG. 8, in the present embodiment, the first reset control module comprises:

a sixth TFT T6 having a gate connected to the signal input terminal IN, a source connected to the low level signal input terminal VGL and a drain connected to the second TFT gate control terminal AC_OUT;

a seventh TFT T7 having a gate connected to the first clock signal input terminal CLK, a source connected to the low level signal input terminal VGL and a drain connected to the second TFT gate control terminal AC_OUT;

a ninth TFT T9 having a gate connected to the second clock signal input terminal CLKB, a source connected to the second TFT gate control terminal AC_OUT and a drain connected to the second clock signal input terminal CLKB;

a tenth TFT T10 having a gate connected to the source of the eleventh TFT T11, a source connected to the low level signal input terminal VGL and a drain connected to the second TFT gate control terminal AC_OUT.

By setting a proportion between a width-length ratio of the tenth TFT T10 and a width-length ratio of the ninth TFT T9, the source of the ninth TFT T9 (that is, the drain of the tenth TFT T10) can be at the low level when high level signals are inputted from the second clock signal input terminal CLKB and the signal input terminal IN (at this time, the tenth TFT T10 and the ninth TFT T9 are turned on). Alternatively, the width-length ratio of the tenth TFT T10 is much more larger than the width-length ratio of the ninth TFT T9, and a resistance of the ninth TFT T9 is much more larger than a resistance of the tenth TFT T10. Therefore, when high level signals are inputted from the second clock signal input terminal CLKB and the signal input terminal IN, the source of the ninth TFT T9 (that is, the drain of the tenth TFT T10) is at the low level due to a voltage division caused by the resistance of the ninth TFT T9 and the resistance of the tenth TFT T10. It is preferable that the width-length ratio of the tenth TFT T10 is 5~10 times of the width-length ratio of the ninth TFT T9.

Operating principles of the shift register sub-unit according to the present embodiment of the present disclosure are as follows:

Although the first reset control module according to the present embodiment has a structure different from that of the first reset control module according to the embodiment 1, it has the same function as that of the first reset control module according to the embodiment 1. Therefore, the timing control diagram of the shift register sub-unit according to the present disclosure is the same as that in FIG. 7, and the operating principles of the shift register sub-unit according to the present embodiment will be explained below in conjunction with FIG. 7.

Hereinafter, for the sake of simplicity of the description, the TFT is represented only by a letter "T" and a corresponding number, for example, the first TFT is represented by T1; meanwhile, the first node is directly represented by point Q, the first capacitor is directly represented by C1, the first clock signal input terminal is directly represented by CLK, the second clock signal input terminal is directly represented by CLKB, the low level signal input terminal is directly represented by VGL, the signal input terminal is directly represented by IN, the signal output terminal is directly represented by OUT(n), the third TFT gate control terminal is directly represented by AC_IN, and the second TFT gate control terminal is directly represented by AC_OUT.

1) A First Period (A Pre-Charging Period):

CLK inputs a low level signal, CLKB inputs a high level signal and IN inputs a high level signal, T11 is turned on and point Q is charged to a high level, such that T10 is turned on. Meanwhile, T9 is turned on by the high level signal inputted from CLKB, the source of T9 (that is, the drain of T10) can be controlled at a low level to make AC_OUT output a low level through setting a proportion between the width-length ratio of T10 and the width-length ratio of T9. It is preferable that, the width-length ratio of T10 is 5~10 times of the width-length ratio of T9 to make sure that the resistance of T9 is much more larger than the resistance of T10, and thus the source of T9 (that is, the drain of T10) is set at a low level via a voltage division caused by the resistances of T9 and T10, and AC_OUT outputs the low level signal. T7 is turned off by the low level signal inputted from CLK, T6 is turned on by the high level signal inputted from IN to make AC_OUT output the low level signal, which makes T2 and T5 being turned off. Since AC_OUT outputs the low level signal during a previous period (that is, the time period of a previous pulse width), AC_IN also inputs the low level signal at this period, so that T3 and T4 are turned off. Point Q is at the high level, and thus T1 is turned on. At this time, T1 is used for transmitting the low level signal from CLK to OUT(n), that is, OUT(n) outputs the low level signal.

2) A Second Period (An Evaluating Period)

CLK inputs a high level signal, CLKB inputs a low level signal and IN inputs a low level signal, T11 is turned off. Point Q floats, the voltage at the point Q increases continuously due to the voltage difference stored across two ends of C1 during the previous period (that is, the pre-charging period), and thus T10 is turned on by the higher level at the point Q, which makes AC_OUT outputs the low level signal. Meanwhile, T9 is turned off by the low level signal inputted from CLKB. T7 is turned on by the high level signal inputted from CLK, T6 is turned off by the low level signal inputted from IN, such that AC_OUT outputs the low level signal, which makes T2 and T5 being turned off. Since AC_OUT outputs the low level signal during a previous period (that is, the pre-charging period), AC_IN also inputs the low level signal at this period, so that T3 and T4 are turned off. As compared with the previous period, the voltage at the point Q increases continuously at this stage, and thus T1 is fully turned on. At this time, T1 is used for transmitting, to OUT(n), the high level signal from CLK without a threshold loss, that is, OUT(n) outputs the high level signal.

3) A Third Period (A Reset Period 1)

CLK inputs a low level signal, CLKB inputs a high level signal and IN inputs a low level signal, T11 is turned on and point Q is pulled down to a low level by the low level signal inputted from IN, such that T10 is turned off Meanwhile, T9 is turned on by the high level signal inputted from CLKB, such that AC_OUT outputs the high level signal, which makes T2 and T5 being turned on. The voltage at point Q is further pulled down by the low level signal from VGL when T5 is turned on. Since AC_OUT outputs the low level signal during a previous period (that is, the evaluating period), AC_IN also inputs the low level signal at this period, so that T3 and T4 are turned off. T7 is turned off by the low level signal inputted from CLK, and T6 is turned off by the low level signal inputted from IN. T1 is turned on since the point Q is at the low level. At this time, T2 is used for transmitting the low level signal from VGL to OUT(n), that is, OUT(n) outputs the low level signal.

4) A Fourth Period (A Reset Period 2)

CLK inputs a high level signal, CLKB inputs a low level signal and IN inputs a low level signal, T11 is turned off. Since point Q is still at a low level, T10 is turned off Meanwhile, T9 is turned off by the low level signal inputted from CLKB, T6 is turned off by the low level signal inputted from IN, and T7 is turned on by the high level signal inputted from CLK, such that AC_OUT outputs the low level signal, which makes T2 and T5 being turned off. Since AC_OUT outputs the high level signal during a previous period (that is, the reset period 1), AC_IN also inputs the high level signal at this period, so that T3 and T4 are turned on. The voltage at point Q is further pulled down by the low level signal from VGL when T4 is turned on, so that the point Q can keep the low level without suffering from interference of other signals and thus T1 is turned off. At this time, T3 is used for transmitting the low level signal from VGL to OUT(n), that is, OUT(n) still outputs the low level signal.

In the first period to the fourth period, the signal input terminal IN inputs a high level signal during the first period, the signal output terminal OUT(n) outputs the high level signal during the second period, and thus one shift is achieved and the first period and the second period can be regarded as operating periods of the shift register sub-unit; In the third and fourth periods, the signal input terminal IN and the signal output terminal OUT(n) output a low level signal, and thus the third and fourth periods are low level maintaining periods of the signal output terminal of the shift register sub-unit.

FIG. 7 only shows a part of a timing control diagram of the shift register sub-unit. Every time the display displays a frame of image, a shift register sub-unit for controlling a certain line of pixels would output a high level signal. Particularly, all of the signal input terminal IN, the first clock signal input terminal CLK, the second clock signal input terminal CLKB, the first node Q, the signal output terminal OUT(n), the second TFT gate control terminal AC_OUT and the third TFT gate control terminal AC_IN will repeat the input timing sequences of the first and second periods; and then all of the signal input terminal IN, the first clock signal input terminal CLK, the second clock signal input terminal CLKB, the first node Q, the signal output terminal OUT(n), the second TFT gate control terminal AC_OUT and the third TFT gate control terminal AC_IN will repeat the input timing sequences of the third and fourth periods; the third and fourth periods will be repeated till the signal input terminal IN inputs the high level signal again, and under such a circumstance, the first and second periods will be repeated, and so on.

Other arrangements and the functions thereof in the present embodiment are the same as those in the embodiment 1, and details omitted.

Embodiment 5

Difference between the present embodiment and the embodiment 4 lies in that, in the present embodiment, all of the plurality of TFTs included in the shift register are P-type TFTs.

The structure of the shift register according to the present embodiment is the same as that of the shift register according to the embodiment 4, except that the low level signal input terminal VGL in the shift register according to the embodiment 4 is replaced with a high level signal input terminal VGH. Moreover, timing control signals (CLK, CLKB, IN, Q, OUT(n), AC_OUT and AC_IN) of the shift register sub-unit of the present embodiment are inverse to the timing control signals of the shift register sub-unit according to the embodiment 4, respectively.

Other arrangements and the functions thereof in the present embodiment are the same as those in the embodiment 4, and details omitted.

Of course, the circuit structure of the shift register according to the present disclosure and the circuit structure of the first and second reset control modules in the shift register are not limited to the above structure, and may also use other circuit structures capable of implementing the same functions.

The above descriptions are only for illustrating the embodiments of the present disclosure, and in no way limit the scope of the present disclosure. It will be obvious that those skilled in the art may make modifications, variations and equivalences to the above embodiments without departing the spirit and scope of the present disclosure as defined by the following claims. Such variations and modifications are intended to be comprised within the spirit and scope of the present disclosure.

What is claimed is:

1. A shift register comprising a plurality of shift register sub-units connected in cascade, each of the plurality of shift register sub-units comprising:
   a first Thin Film Transistor (TFT) having a gate connected to a first node, a source connected to a signal output terminal and a drain connected to a first clock signal input terminal;
   a second TFT having a gate connected to a second TFT gate control terminal, a source connected to a level signal input terminal and a drain connected to the signal output terminal;
   a third TFT having a gate connected to a third TFT gate control terminal, a source connected to the level signal input terminal and a drain connected to the signal output terminal;
   an eleventh TFT having a gate connected to a second clock signal input terminal, a source connected to the first node and a drain connected to a signal input terminal;
   a first capacitor connected between the first node and the signal output terminal;
   a first reset control module connected to the source of the eleventh TFT, the level signal input terminal, the signal input terminal, the first clock signal input terminal, the second clock signal input terminal and the second TFT gate control terminal, respectively, and for controlling the second TFT to be turned on or off,
   wherein, besides the shift register sub-unit at a first stage, for each of the shift register sub-units at other stages, the second TFT gate control terminal thereof is connected to the third TFT gate control terminal of the shift register sub-unit at a previous stage for controlling the third TFT in the shift register sub-unit at the previous stage to be turned on or off.

2. The shift register of claim 1, wherein the first reset control module comprises:
   a sixth TFT having a gate connected to the signal input terminal, a source connected to the level signal input terminal and a drain connected to the second TFT gate control terminal;
   a seventh TFT having a gate connected to the first clock signal input terminal, a source connected to the level signal input terminal and a drain connected to the second TFT gate control terminal;
   a eighth TFT having a gate connected to a second node, a source connected to the second TFT gate control terminal and a drain connected to the second clock signal input terminal;
   a ninth TFT having a gate connected to the second clock signal input terminal, a source connected to the second node and a drain connected to the second clock signal input terminal;
   a tenth TFT having a gate connected to the source of the eleventh TFT, a source connected to the level signal input terminal and a drain connected to the second node.

3. The shift register of claim 1, wherein the first reset control module comprises:
   a sixth TFT having a gate connected to the signal input terminal, a source connected to the level signal input terminal and a drain connected to the second TFT gate control terminal;
   a seventh TFT having a gate connected to the first clock signal input terminal, a source connected to the level signal input terminal and a drain connected to the second TFT gate control terminal;
   a ninth TFT having a gate connected to the second clock signal input terminal, a source connected to the second TFT gate control terminal and a drain connected to the second clock signal input terminal;
   a tenth TFT having a gate connected to the source of the eleventh TFT, a source connected to the level signal input terminal and a drain connected to the second TFT gate control terminal.

4. The shift register of claim 2, wherein a width-length ratio of the tenth TFT is 5~10 times of a width-length ratio of the ninth TFT.

5. The shift register of claim 1, wherein the shift register sub-unit further comprises a second reset control module connected to the first node, the second TFT gate control terminal, the third TFT gate control terminal and the level signal input terminal, respectively, and for controlling the first node to be reset.

6. The shift register of claim 5, wherein the second reset control module comprises:
   a fourth TFT having a gate connected to the third TFT gate control terminal, a source connected to the level signal input terminal and a drain connected to the first node;
   a fifth TFT having a gate connected to the second TFT gate control terminal, a source connected to the level signal input terminal and a drain connected to the first node.

7. The shift register of claim 1, wherein
   an initial pulse signal is inputted to the signal input terminal of the shift register sub-unit at the first stage; and besides the shift register sub-unit at a last stage, for each of the shift register sub-units at other stages, the signal output terminal thereof is connected to the signal input terminal of the shift register sub-unit at a next stage;

in each of the shift register sub-units, a clock signal inputted from the second clock signal input terminal is inverse to a clock signal inputted from the first clock signal input terminal;

clock signals inputted from the first clock signal input terminals of the shift register sub-units at two adjacent stages are inverse to each other, and clock signals inputted from the second clock signal input terminals of the shift register sub-units at two adjacent stages are inverse to each other.

8. The shift register of claim 1, wherein respective TFTs included in each of the shift register sub-units are all N-type TFTs or P-type TFTs.

9. A gate driving circuit comprising a shift register implemented by the shift register according to claim 1.

10. A display comprising a gate driving circuit implemented by the gate driving circuit according to claim 9.

11. The shift register of claim 3, wherein a width-length ratio of the tenth TFT is 5~10 times of a width-length ratio of the ninth TFT.

12. The shift register of claim 2, wherein an initial pulse signal is inputted to the signal input terminal of the shift register sub-unit at the first stage; and besides the shift register sub-unit at a last stage, for each of the shift register sub-units at other stages, the signal output terminal thereof is connected to the signal input terminal of the shift register sub-unit at a next stage;

in each of the shift register sub-units, a clock signal inputted from the second clock signal input terminal is inverse to a clock signal inputted from the first clock signal input terminal;

clock signals inputted from the first clock signal input terminals of the shift register sub-units at two adjacent stages are inverse to each other, and clock signals inputted from the second clock signal input terminals of the shift register sub-units at two adjacent stages are inverse to each other.

13. The shift register of claim 3, wherein an initial pulse signal is inputted to the signal input terminal of the shift register sub-unit at the first stage; and besides the shift register sub-unit at a last stage, for each of the shift register sub-units at other stages, the signal output terminal thereof is connected to the signal input terminal of the shift register sub-unit at a next stage;

in each of the shift register sub-units, a clock signal inputted from the second clock signal input terminal is inverse to a clock signal inputted from the first clock signal input terminal;

clock signals inputted from the first clock signal input terminals of the shift register sub-units at two adjacent stages are inverse to each other, and clock signals inputted from the second clock signal input terminals of the shift register sub-units at two adjacent stages are inverse to each other.

14. The shift register of claim 5, wherein an initial pulse signal is inputted to the signal input terminal of the shift register sub-unit at the first stage; and besides the shift register sub-unit at a last stage, for each of the shift register sub-units at other stages, the signal output terminal thereof is connected to the signal input terminal of the shift register sub-unit at a next stage;

in each of the shift register sub-units, a clock signal inputted from the second clock signal input terminal is inverse to a clock signal inputted from the first clock signal input terminal;

clock signals inputted from the first clock signal input terminals of the shift register sub-units at two adjacent stages are inverse to each other, and clock signals inputted from the second clock signal input terminals of the shift register sub-units at two adjacent stages are inverse to each other.

15. The shift register of claim 6, wherein an initial pulse signal is inputted to the signal input terminal of the shift register sub-unit at the first stage; and besides the shift register sub-unit at a last stage, for each of the shift register sub-units at other stages, the signal output terminal thereof is connected to the signal input terminal of the shift register sub-unit at a next stage;

in each of the shift register sub-units, a clock signal inputted from the second clock signal input terminal is inverse to a clock signal inputted from the first clock signal input terminal;

clock signals inputted from the first clock signal input terminals of the shift register sub-units at two adjacent stages are inverse to each other, and clock signals inputted from the second clock signal input terminals of the shift register sub-units at two adjacent stages are inverse to each other.

* * * * *